United States Patent
Martinson

[19]

[11] Patent Number: 6,127,962
[45] Date of Patent: Oct. 3, 2000

[54] IMAGE REJECTION MIXER

[75] Inventor: Glen D. Martinson, Oakville, Canada

[73] Assignee: BEL-Tronics Company, Mississauga, Canada

[21] Appl. No.: 09/097,261

[22] Filed: Jun. 15, 1998

[51] Int. Cl.[7] ................................................. G01S 7/40
[52] U.S. Cl. ........................ 342/20; 342/159; 342/172; 342/195; 331/42; 455/313; 455/323
[58] Field of Search ................................. 455/130, 149, 455/188.1, 189.1, 269, 280, 293, 323–333, 313; 331/42, 43; 342/20, 159, 175, 192–197

[56] References Cited

U.S. PATENT DOCUMENTS

| | | |
|---|---|---|
| 3,942,120 | 3/1976 | Ham . |
| 4,132,952 | 1/1979 | Hongu et al. . |
| 4,584,715 | 4/1986 | Baars et al. ............................ 455/325 |
| 4,789,846 | 12/1988 | Matsunga et al. . |
| 4,862,175 | 8/1989 | Biggs et al. ............................ 342/20 |
| 5,049,884 | 9/1991 | Jaeger et al. ............................ 342/20 |
| 5,068,663 | 11/1991 | Valentine et al. ....................... 342/20 |
| 5,517,687 | 5/1996 | Westinghouse . |
| 5,640,694 | 6/1997 | Northrop . |
| 5,703,545 | 12/1997 | Dullberg et al. . |

FOREIGN PATENT DOCUMENTS

0793356A2  9/1997  European Pat. Off. .

OTHER PUBLICATIONS

"Scanlock Mark VB" brochure; Technical Services Agency, Inc.; publication place and date not given.

*Primary Examiner*—Bernarr E. Gregory
*Attorney, Agent, or Firm*—Donald E. Hewson

[57] ABSTRACT

There is provided an image rejection mixer for downconversion of an incoming signal to a lower intermediate frequency signal, using the absolute difference of frequencies between the incoming signal and the local oscillator signal. The image rejection mixer is set up to accept and downconvert incoming signals at two discrete frequencies $f_h$ and $f_l$, where the local oscillator frequency is positioned mid-way between those frequencies $f_h$ and $f_l$. There are two signal paths in the image rejection mixer, either one or the other of which is chosen by positioning a controllable single pole, double throw switch into one of its two switch positions. The output of the switch is led to a mixing element, from which an intermediate frequency signal is derived. The first of the two signal paths from the input to the image rejection mixer to the mixing element has a bandpass characteristic centered at one or the other of the two input frequencies of interest; the other signal path has a bandstop characteristic centered at the same frequency. By choosing one or the other of the signal paths, an incoming signal at a designated one or the other of the incoming signal frequencies may be downconverted, and the image signal and any noise at that image signal frequency will be rejected.

20 Claims, 5 Drawing Sheets

OSCILLATOR INJECTION
| | | | LOW SIDE | | HIGH SIDE | |
|---|---|---|---|---|---|---|
| $f_{164MAX}$ | $f_{164MIN}$ | $f_{112}$ | $f_{160MAX}$ | $f_{160MIN}$ | $f_{160MAX}$ | $f_{160MIN}$ |
| 16 | 15 | 5 | 21 | 20 | 11 | 10 |
| 16 | 15 | 3 | 19 | 18 | 13 | 12 |
FIG. 8
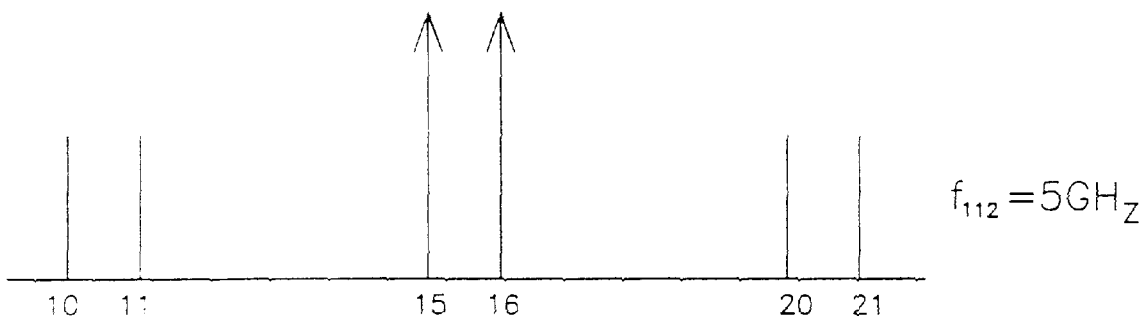
$f_{112} = 5 GH_z$
FIG. 9
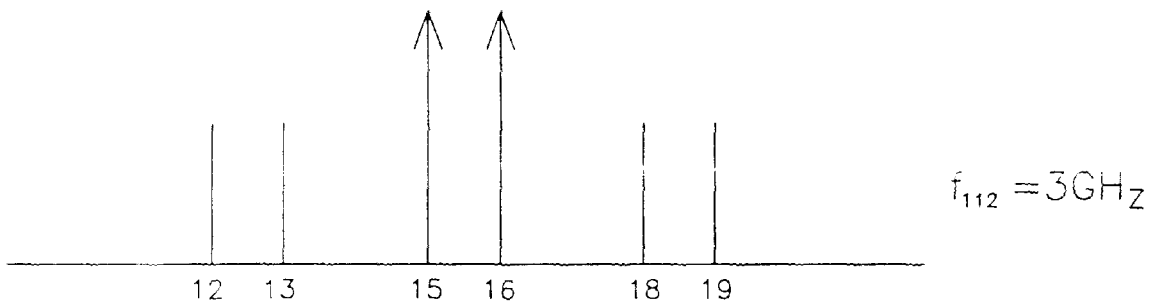
$f_{112} = 3 GH_z$
FIG. 10

IMAGE REJECTION MIXER

FIELD OF THE INVENTION

This invention relates to mixers, particularly radio frequency mixers used in radar detectors, telephony, and the like. Specifically, the present invention is directed to mixers whose purpose is to downconvert—that is, to reduce—the frequency of an incoming desired signal to a lower intermediate frequency signal. The mixers of the present invention function as image rejection mixers whereby selective downconversion of signals at frequencies which are both above and below a local oscillator signal may be achieved with conversion of the desired signal and rejection of the undesired image signal. The present invention provides various topology for such mixers.

BACKGROUND OF THE INVENTION

Typical applications or uses of relatively high radio frequency mixers are in radar and telephony; typically, at radio frequencies having very short wavelengths. Typical installations include the front end circuitry for high radio frequency receivers such as cordless or cellular telephones and the like; and other particularly typical circuit uses of high frequency downconversion mixers are in several stages from the front end towards signal processing circuitry of radar detectors.

In any event, it is usual for mixers to be applied in order to downconvert or reduce the frequency of an incoming signal at a particular desired frequency to a lower intermediate frequency. As is well known, this is accomplished by mixing the incoming signal, at its frequency, with a local oscillator signal which is at a different frequency. The output of the mixer will then contain a frequency component which is at a frequency that is equal to the magnitude of the difference of the incoming signal frequency and the local oscillator signal frequency. That output signal at that frequency component is termed the intermediate frequency signal; and, as noted, the frequency of the intermediate frequency signal will be equal to the difference between the frequency of the incoming signal and the local oscillator signal. It will be clear, from the above, that the frequency of the incoming desired signal may be above, or below, the frequency of the local oscillator signal, by an amount which is equal to the intermediate frequency signal which is derived from the mixer. In other words, a mixer circuit may be set up to derive an intermediate frequency at a desired frequency from either of two incoming frequencies of particular interest, by establishing a local oscillator signal which will be mixed with the incoming signals where the frequency of the local oscillator signal falls halfway between the two frequencies of the incoming signals.

The application of a local oscillator signal to a mixing element—typically, a diode or a pair of diodes connected in anti-parallel, although many other electronic components can be used as mixing elements, as is well known—is termed to be local oscillator signal injection to the mixer. If the frequency of the local oscillator is higher than the frequency of the incoming signal, then the local oscillator injection is said to be high side injection. Likewise, if the frequency of the local oscillator is less than the frequency of the incoming signal, then the local oscillator injection to the mixer is said to be low side injection. As noted, the difference between the local oscillator frequency and the incoming frequency, whichever is higher or whichever is lower, is the intermediate frequency.

However, if the local oscillator signal is high side injected, in other words the local oscillator frequency is greater than the frequency of the incoming signal by an amount equal to the intermediate frequency, there will also exist another frequency at the input of the mixer which is equal to the local oscillator frequency plus the intermediate frequency. That signal is termed an image signal, and it is above the local oscillator frequency by the same amount that the incoming signal is below the local oscillator frequency. Likewise, if the local oscillator signal is low side injected, then in the presence of a desired signal which is above the local oscillator frequency by an amount equal to the intermediate frequency, there will exist below the local oscillator signal frequency an image signal which is below the local oscillator frequency by an amount equal to the intermediate frequency.

The above discussion leads to the following: When signals are received in a mixer at incoming signal frequencies which are both above and below the frequency of the local oscillator, in the circumstances that a valid signal may exist on one side of the local oscillator frequency but not the other, noise which is downconverted from the side that has no valid signal will tend to obscure the downconverted signal from the side of the local oscillator frequency where there was a valid signal. In other words, even though there may only be one of the two desired signal frequencies actually present and being detected and downconverted, noise from the other frequency at which a signal might be found but does not exist will, however, itself be downconverted. Thus, a mixer which will receive signals at frequencies which are both above and below the local oscillator signal will, in effect, have twice the noise floor of a system which permits downconversion from only one side of the local oscillator frequency.

Typically, and until now, the term "image rejection mixer" has been specifically directed to mixers which downconvert an incoming signal which is located at one side or the other of the local oscillator frequency. As noted above, there will be downconversion of a signal from the other side of the local oscillator, the image signal, and it is never totally eliminated. However, a good image rejection mixer in keeping with ordinary conventional designs can be arranged to attenuate the image signal by a minimum of 15 dB. Indeed, an image rejection mixer which has 15 dB of image rejection will have a noise floor which is only 0.14 dB greater than that of an ideal image rejection mixer that will totally reject an image signal.

On the other hand, the present application quite unexpectedly teaches an image rejection mixer, and various topologies therefor, whereby selective downconversion of one or the other of incoming signals at frequencies which are both above and below a local oscillator signal can be attained, so as to achieve a specified intermediate frequency, while at the same time achieving image rejection for the selected downconversion whereby an image signal at the other of the two incoming signal frequencies which is not being downconverted will be rejected.

As will be discussed in greater detail hereafter, the present invention specifically includes a controllable switch by which one or the other of the two incoming signals which are positioned above and below the local oscillator signal frequency, respectively, may be applied to a mixing element. In a sense, therefore, the employment of a switch in keeping with the present invention provides a mixer topology whereby the mixer can be configured to become either a downconverter mixer which will downconvert signals from the high side of the local oscillator frequency, or which will downconvert signals from the low side of the local oscillator frequency, while rejecting the image signal from the lower or higher side of the local oscillator frequency, respectively.

Still further, as will be discussed in greater detail hereafter, the present invention provides topologies for image rejection mixers whereby two signal paths which are switchable using a controllable switch, as noted immediately above, will possess either a signal bandpass characteristic or a signal bandstop characteristic, each at the same frequency, and each at one or the other of the desired signal frequencies which is either above or below the local oscillator frequency.

DESCRIPTION OF THE PRIOR ART

Several prior art patents are of general interest, insofar as they demonstrate the utilization of filters, rejection circuits and so on.

DüLLBERG et al U.S. Pat. No. 5,703,545, issued Dec. 30, 1997, teaches a filter circuit, the claims of which are specifically directed to a circuit including an amplifier stage, a bandpass filter which is coupled downstream of the amplifier, and a filter which is coupled upstream of the amplifier and which has at least one trap which comprises a rejection circuit tuned to an intermediate frequency, together with a series-tuned circuit tuned to an image frequency. The rejection circuit and the series-tuned circuit have a common inductance. What is provided, therefore, is a circuit which isolates a wanted signal from an adjacent interference signal; the utilization of the circuit may be particularly useful in the front end tuners of television receivers.

Another patent of some interest is NIEHENKE et al, U.S. Pat. No. 5,517,687, issued May 14, 1996. Here, millimeter wavelength signals are mixed with an external source local oscillator frequency through a phase shifter to a second sub-harmonic mixer. The arrangement is such that the first and second sub-harmonic mixers will mix the local oscillator frequency with an input signal, which includes both a desired frequency and an image frequency, so as to produce an intermediate frequency which has the desired component and an image component which is at a selected phase. A further phase shifter separates and terminates the image component of the intermediate frequency. The input port which feeds the input signal to each of the sub-harmonic mixers is, itself, dimensioned so as to provide a virtual image short termination or an image short termination to a self-generated image signal from each sub-harmonic mixer, thereby decreasing the conversion loss of the frequency mixer.

Finally, MILTON U.S. Pat. No. 5,640,694, issued Jun. 17, 1997, teaches an integrated radio frequency avionics system having a common intermediate frequency interface for such diverse functions as radar, electronic wave form, communications/navigation identification channels. The interface uses a segmented band of a variety of intermediate frequencies, which are subdivided into two or more individual band segments, each separated by a guard band segment. In this case, the lower frequency band segment comprises a narrow band segment which is assigned to radar functions, while the other or upper band segment comprises a wide band segment assigned to the other functions to be tuned and downconverted. The guard band is not used for signal transmission, and it is left unused to permit bandpass filters to reject signals in the adjacent unwanted segment. This achieves frequency separation across the intermediate frequency band, while still allowing the use of common hardware. The range of the intermediate frequency band is such that the various radar and other signals can be separated from each other using practical filters, while still being routed through a common intermediate frequency switch network. Signals from the various types of antennas which are used to receive the varying signals to be converted are through a radio frequency switch network to a bank of frequency converters, whereby they are converted to a particular intermediate frequency within the designated intermediate frequency band.

SUMMARY OF THE INVENTION

Details of the present invention, and some of the theory underlining one of the principal factors of the present invention whereby a controllable switch is utilized to select from one or the other of two incoming signals at frequencies above or below the local oscillator frequency, to apply that signal to a mixing element and to reject the image frequency signal, will be discussed hereafter.

In the meantime, it is worth noting that the principal purpose of the present invention is to provide an image rejection mixer for downconversion of an incoming signal to a lower intermediate frequency signal, using the absolute difference of frequencies between the incoming signal and a local oscillator signal. The frequency $f_{lo}$ of the local oscillator signal is chosen so as to provide an intermediate frequency signal at a frequency $f_{if}$ for either of two incoming signals at frequencies $f_h$ and $f_l$, respectively. Frequency $f_h$ is above frequency $f_{lo}$, and frequency $f_l$ is below frequency $f_{lo}$, each by an amount equal to the intermediate frequency $f_{if}$. Thus, the following conditions will apply:

$$f_{if} = f_h - f_{lo}$$

and $$f_{if} = f_{lo} - f_l.$$

Moreover, when a signal exists at frequency $f_h$, an image frequency signal will exist at $f_l$, as $f_l = f_{lo} - f_{if}$.

Likewise, when a signal exists at frequency $f_l$, an image frequency signal will exist at $f_h$, as $f_h = f_{lo} + f_{if}$.

The image rejection mixer of the present invention comprises an input port at which either or both of the incoming signals at frequencies $f_h$ and $f_l$ may be present. The image rejection mixer further comprises a controllable switch means, a control signal input port for the controllable switch means, a mixing element, a mixer local oscillator input port at which the local oscillator signal at frequency $f_{lo}$ is applied, and a mixer intermediate frequency output port from which the intermediate frequency signal at frequency $f_{if}$ is taken.

The controllable switch means has two switch positions, and it will assume either of the two switch positions under the control of control signals which are applied to the control signal input port.

In operation, signals from the mixer local oscillator input port are applied to the mixing element; and intermediate frequency signals are derived from the mixing element and applied to the mixer intermediate frequency output port, for further handling.

The mixing element, however, is preceded by the controllable switch means which has two positions; and, in a first switch position, a signal at frequency $f_h$ is fed from the mixer input port to the mixing element, and an image signal at frequency $f_l$ is rejected and decoupled from the mixing element. Likewise, in the second switch position of the controllable switch means, a signal at frequency $f_l$ is fed from the mixer input port to the mixing element, and an image signal at frequency $f_h$ is rejected and decoupled from the mixing element.

Thus, the intermediate frequency signal at frequency $f_{if}$ comprises a downconverted signal which represents either of the input signals at frequencies $f_h$ and $f_l$, respectively, together with any noise which may occur at either of those same input signal frequencies; however, the intermediate frequency signal is substantially devoid of a downconverted signal representing the other of the input signals at frequencies $f_l$ and $f_h$, respectively, together with any noise which may occur at that same image frequency.

The controllable switch may comprise a pair of controllable FETs, either one of which may be turned on while the other is turned off, by the application of signals to the control signal input port. Thus, the pair of controllable FETs may be made to assume either of the first and second switch positions, respectively. Alternatively, other electronic switching elements which are capable of functioning as a single pole, double throw switch may be utilized. In either event, a first signal path is connected between the mixer input port and the mixing element when the controllable switch is in its first switch position, and a second signal path is connected between the mixer input port and the mixing element when the controllable switch is in its second switch position.

Moreover, and in any event, the first signal path has a bandpass characteristic at a selected frequency which is either of the input frequencies $f_h$ and $f_l$; and the second signal path has a bandstop characteristic at the same selected frequency, $f_h$ or $f_l$, as was selected for the bandpass frequency of the first signal path.

Thus, the first and second signal paths are selectable by controlling the controllable switch means by the application of signals to the control signal input port, so as to assume either of the first and second switch positions, respectively, and thereby so as to connect either of the first signal path or the second signal path from the mixer input port to the mixing element.

Specifically, as will be noted hereafter, the topology of the present invention is such that the first selectable signal path will generally include a microstrip bandpass filter structure, and the second selectable signal path will generally include a microstrip bandstop filter structure; each being such as to have their bandpass or bandstop characteristic at the same selected frequency. Moreover, the first and second selectable signal paths are coupled to each other at the same selected frequency as the bandpass characteristic and bandstop characteristic are exhibited.

Several particular situations are contemplated by the present invention whereby the image rejection mixer of the present invention may be employed in such as the front end for a high radio frequency receiver, or in a front end for a broad band, multi-band radar detector.

When used in a high radio frequency receiver, the receiver will comprise a receiving antenna, a first local oscillator, and first mixer. However, the first local oscillator will be under the control of a sweep controller and a microprocessor, so that the first intermediate frequency signal derived from the first mixer will be at one of a first high intermediate frequency signal $f_h$ and a second low intermediate frequency signal $f_l$, respectively. Thereafter, a second mixer —which is essentially the image rejection mixer of the present invention—is provided, the input signals to which are the first high intermediate frequency signal $f_h$ or the second low intermediate frequency signal $f_l$, with a second local oscillator input port providing a second local oscillator frequency $f_{lo2}$ which is chosen so that an intermediate frequency signal will be derived from the image rejection mixer in keeping with the present invention at frequency $f_{if2}$, for either of the two incoming signals at the respective frequencies $f_h$ and $f_l$.

Likewise, when utilized in the front end of a broad band, multi-band radar detector, a third mixer may be provided, having a signal input port into which the second intermediate signal at frequency $f_{if2}$ is applied, and from which a third intermediate frequency is derived for further signal processing. Otherwise, and in any event, the radar detector comprises additional signal handling circuitry after the image rejection mixer.

BRIEF DESCRIPTION OF THE DRAWINGS

The novel features which are believed to be characteristic of the present invention, as to its structure, organization, use and method of operation, together with further objectives and advantages thereof, will be better understood from the following drawings in which a presently preferred embodiment of the invention will now be illustrated by way of example. It is expressly understood, however, that the drawings are for the purpose of illustration and description only and are not intended as a definition of the limits of the invention. Embodiments of this invention will now be described by way of example in association with the accompanying drawings in which:

FIG. 8 is a table demonstrating the effect of varying a first local oscillator so as to be able to select a number of incoming frequencies of interest and still maintain image rejection;

FIG. 9 is frequency graph demonstrating the effect of the choice of one selectable input frequency to an image rejection mixer in keeping with the present invention;

FIG. 10 is a frequency graph similar to FIG. 9 showing the effect of choosing the other, paired, input frequency to an image rejection mixer in keeping with the present invention.

DETAILED DESCRIPTION OF THE PREFERRED EMBODIMENTS

Figure 1:
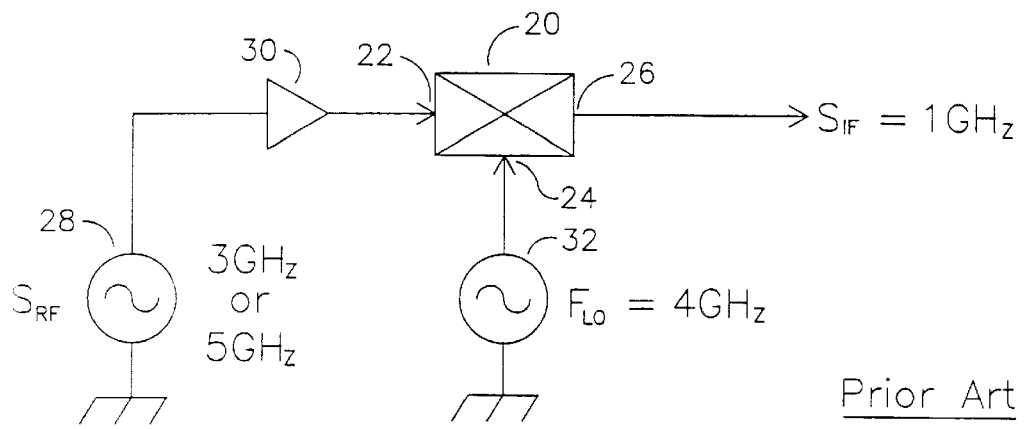
FIG. 1 is a general schematic of a mixer, as known in the prior art.

Turning first to FIGS. 1 through 3, some discussion of the requirement for image rejection now follows:

FIG. 1 shows a typical general schematic for a mixer, and is noted as being one which will be found in the prior art. The mixing circuit of FIG. 1 comprises, typically, a mixer 20—which is typically a diode or a pair of diodes connected in anti-parallel, but which may be any other suitable non-linear active electronic device such as a transistor, etc., together with associated passive filter elements as necessary—and there are two signals which are input to the mixer 20 and one signal which is derived from the mixer 20. The mixer 20 has an incoming signal input port at 22, and a local oscillator input port at 24. An intermediate frequency output port is at 26.

An input signal is derived from any source; and, in this case, the incoming signal source is shown to be an oscillator 28 which may have an output frequency of either 3 GHz or 5 GHz. For purposes of this discussion, the input frequency, whether it is 3 GHz, 5 GHz, or any other frequency, is designated to have a frequency $S_{RF}$. Typically, though not necessarily, the input signal $S_{RF}$ may pass through a broad band amplifier 30 before being applied to the mixer 20 at incoming signal port 22.

The local oscillator signal is derived from a local oscillator 32, and is applied to the mixer local oscillator input port 24. For purposes of this discussion, the frequency of the local oscillator signal $F_{LO}$ will be assumed to be 4 GHz, but that frequency could be any other desired frequency.

It will be seen that no matter whether the incoming signal $S_{RF}$ is at 3 GHz or 5 GHz, with the frequency $F_{LO}$ of the local oscillator being set at 4 GHz, there will be derived from the intermediate frequency output port 26 an intermediate frequency signal $S_{IF}$, which will be at a frequency of 1 GHz. Thus, the intermediate frequency signal $S_{IF}$ is at a frequency which is lower than either of the incoming signal frequencies, and is the absolute difference of the frequencies between the incoming signal and the local oscillator signal, no matter whether the frequency $F_{LO}$ of the local oscillator signal is higher or lower than the frequency of the incoming signal $S_{RF}$.

Figure 2A:
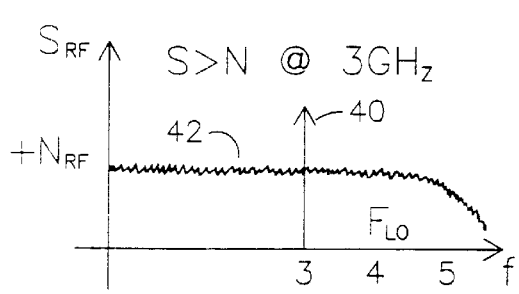
FIGS. 2a and 2b show a signal at a signal frequency together with broad spectrum noise, and the downconverted signal together with the noise at the first signal frequency and the image noise.

It is assumed, of course, that the amplifier 30, if used, is a fairly broad band amplifier; and that, in any event, the frequency handling characteristics of the frequency mixing circuit of FIG. 1 are such that they are substantially flat at the frequencies of interest. Accordingly, there is shown in FIG. 2a a typically characteristic signal spectrum of the input signals $S_{RF}$ and the input signal noise $N_{RF}$. Here, there is a specific signal which is set, in this case, at 3 GHz, as shown at 40. There is a typical noise floor 42 which is fairly flat, with roll off occurring above any frequency of interest. It is noted that the level of the incoming signal at 40 is higher than the level of the noise floor at 42. It is also noted, in particular, the noise floor 42 also exists at 5 GHz.

Figure 2B:
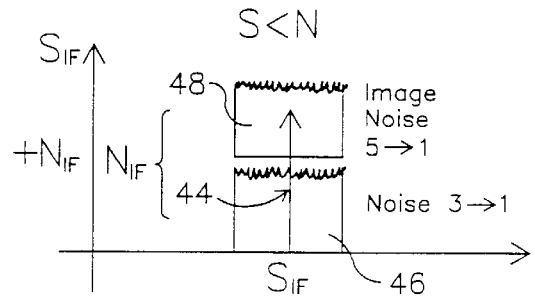

Referring to FIG. 2b, the intermediate frequency signal $S_{IF}$ is shown at 44 to have the same general level as the incoming signal 40. There is also shown the downconverted signal noise 46, which is the noise component from the noise spectrum centred about the incoming signal 40, and which is due to the downconversion from the frequency 3 GHz to 1 GHz at the same time as the incoming signal is downconverted to $S_{IF}$ at 1 GHz. However, in the absence of circuitry such as that provided by the present invention, there will also occur an image noise, as shown at 48. This is because an image signal will also occur at the same absolute difference of frequencies between the frequency of the incoming signal and the frequency of the local oscillator signal, but at the other side of the local oscillator frequency from that of the incoming signal. Since the noise is essentially the same at, in this case, 5 GHz as it is at 3 GHz, the noise 48 which is about the image frequency, adds to the image noise 46 which is about the signal frequency, with the resultant consequence being that the level of the desired signal $S_{IF}$ is less than the combined signal noise and image noise. In other words, the resultant intermediate frequency signal is obscured by the noise in such circumstances.

Figure 3A:
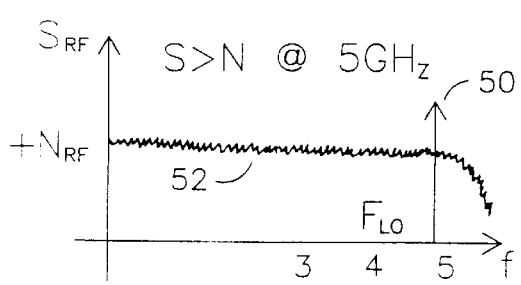
FIGS. 3a and 3b are similar to FIGS. 2a and 2b, but where the applied signal is at a frequency higher than the local oscillator frequency.
Figure 3B:
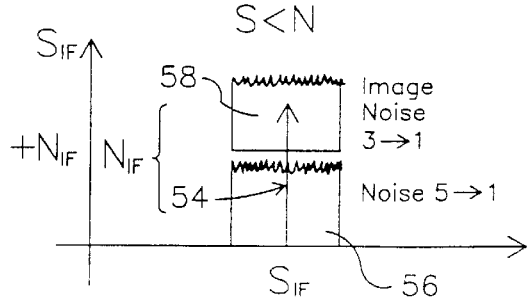

The same conditions apply as to FIGS. 3a and 3b, except that the signal 50 is set at 5 GHz, above the signal noise floor 52; and the derived signal $S_{IF}$, shown at 54, is once again less than the noise due to the additive nature of the downconverted noise 56 from the 5 GHz signal, together with the image noise 58.

However, in keeping with the present invention, a topology for a downconversion mixer which will accept signals at either of two frequencies while rejecting an image signal at the other of the incoming signal frequencies, is provided.

Figure 4:
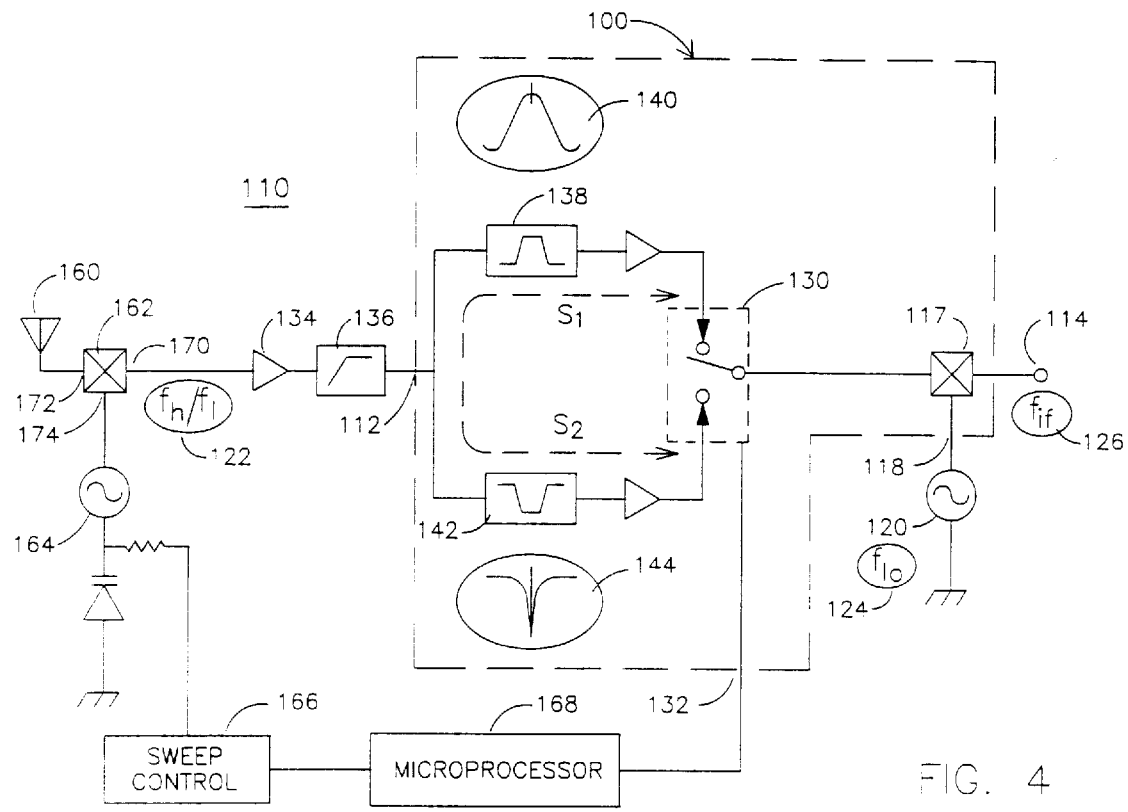
FIG. 4 is a general schematic of a first embodiment of the present invention.
Figure 5:
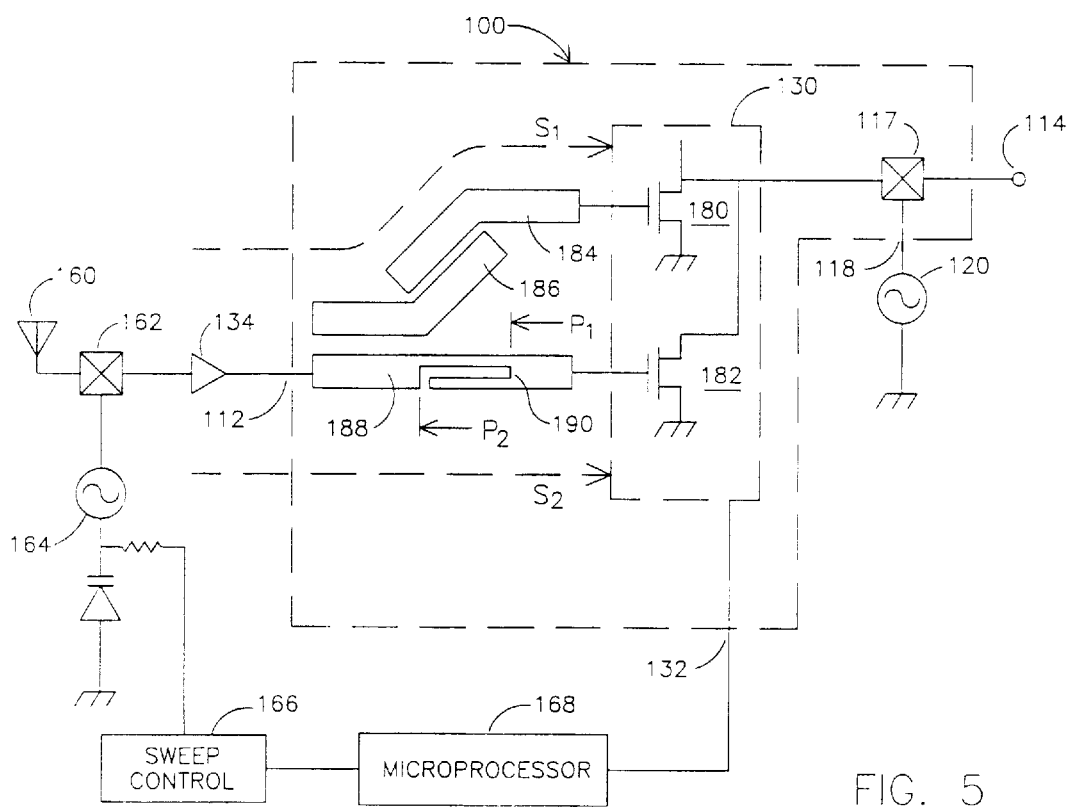
FIG. 5 is a general schematic similar to that of FIG. 4 but with more specific topology as to the controllable switch and as to the bandpass and bandstop filters which are utilized.
Figure 6:
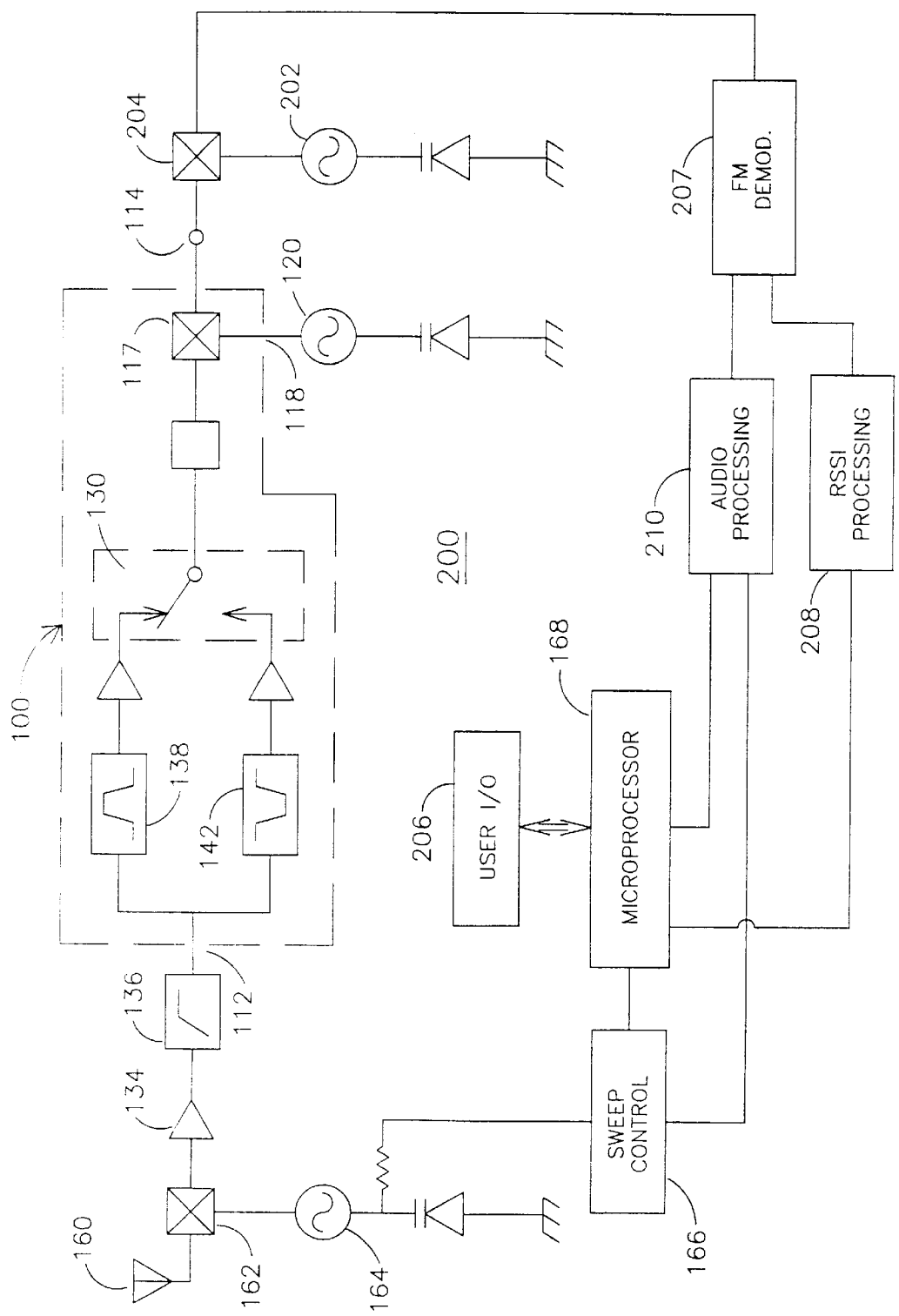
FIG. 6 is a general schematic showing use of an image rejection mixer in keeping with the present invention in the front end of a broad band, multi-band radar detector.

Referring now to FIG. 4, a circuit is shown which employs an image rejection mixer 100, in keeping with the present invention. Moreover, it will be noted that the same reference numeral 100 will be used throughout the following discussion to designate an image rejection mixer, the specific details of which may vary, but the functioning of which remains exactly the same in all embodiments which are discussed hereafter. Indeed, as will be noted, the general application of the image rejection mixer as it is shown in each of FIGS. 4 and 5 is essentially identical, with FIG. 5 showing the image rejection portion of the topology of an image rejection mixer circuit, such as that of FIG. 4. Likewise, the same conditions apply to the broad band, multi-band radar detector utilization of an image rejection mixer in keeping with the present invention, as shown in FIG. 6.

In FIG. 4, a specific image rejection mixer 110 is provided. However, it is important to note that, for the initial discussion of the image rejection mixer, the incoming signal will be considered to be one of two signals, at two discrete frequencies, in the same manner as the incoming signal to the mixer of FIG. 1 may be considered to be a signal at one or the other, or both, of two different frequencies.

Assume, therefore, that there is an incoming signal at the mixer input port 112, where the frequency of the incoming signal may be at either or both of frequencies $f_h$ and $f_l$—a high incoming signal frequency and a low incoming signal frequency, respectively. However, the image rejection mixer will downconvert one or the other of the incoming signal frequencies to be come a lower intermediate frequency signal at frequency $f_{if}$ which will be derived from the mixer intermediate frequency output port 114. Thus, the intermediate frequency signal at frequency $f_{if}$ will represent whichever of the incoming signals at frequencies $f_h$ or $f_l$ is of particular interest at any instant in time, while ensuring that there is image rejection of any signal or noise at the other of the two frequencies $f_l$ or $f_h$ which is not of particular interest at that instant in time.

Included in the mixer is a non-image rejection mixer 117 which includes a mixing element 116. There is a mixer local oscillator input port 118 to which a local oscillator signal is applied. The local oscillator signal, in this instance, comes from a second local oscillator 120 (being a second local oscillator within the context of the overall circuit of FIGS. 4, 5, and 6) and the signal from the local oscillator 120 is at frequency $f_{lo}$.

Figure 11:
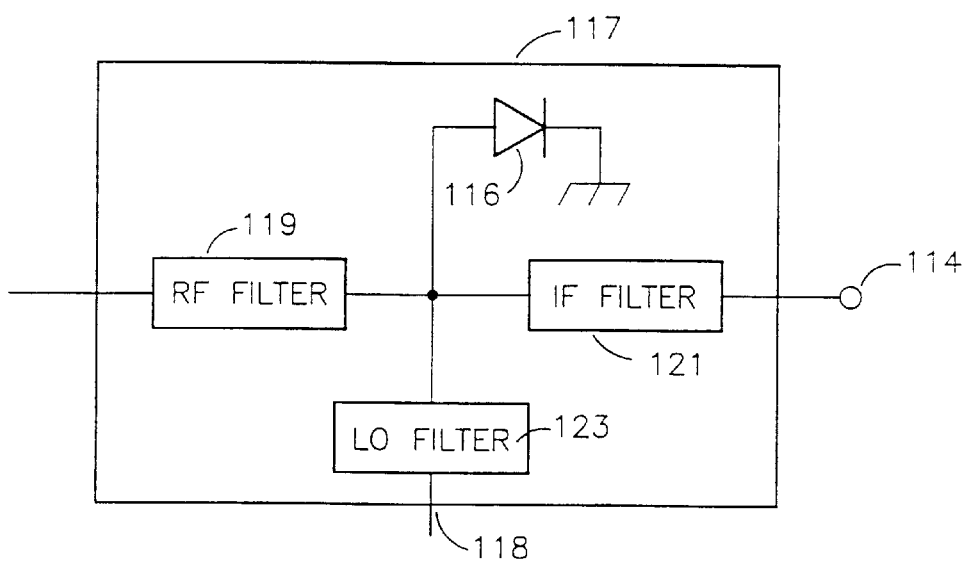
FIG. 11 is typical block schematic of non-image rejection mixer structure including a mixing element which is an essential element of the image rejection mixer in keeping with the present invention.

Referring briefly to FIG. 11, a typical block schematic of a non-image rejection mixer 117, as employed in the present invention, is shown. The principal component of the mixer 117 is, indeed, the mixing element 116, which is the only active element in the mixer 117—and which, as noted above, may be any non-linear component such as a diode, a pair of anti-parallel diodes, a transistor, etc. The remaining elements which are typically included in such a mixer 117 include a high frequency (radio frequency) or RF filter 119, an intermediate frequency or IF filter 121, and a local oscillator or LO filter 123. The mixer intermediate frequency output port 114, and the mixer local oscillator input port 118, are both shown. Of significant importance is that the mixer 117 includes an active mixing element 116, as discussed immediately above.

The presence of signals at frequencies $f_h$ and/or $f_l$ at the mixer input port 112, at frequency $f_{lo}$ at mixer local oscillator input port 118, and at intermediate frequency $f_{if}$ derived from intermediate frequency output port 114, are indicated by circles 122, 124, and 126, respectively. As discussed above, the relationship among those various signals at the indicated frequencies is such that the frequency $f_{lo}$ is chosen so as to provide an intermediate frequency signal at frequency $f_{if}$ by using the absolute difference of frequencies between the incoming signal and the local oscillator signal; and the frequency $f_{lo}$ of the local oscillator signal is chosen so as to provide the intermediate frequency signal at frequency $f_{if}$ for either of the two incoming signals at frequencies $f_h$ and $f_l$, respectively, whereby:

$$f_{if} = f_h - f_{lo}$$

and $$f_{if} = f_{lo} - f_l.$$

As discussed above, for signals at frequency $f_h$, an image frequency signal exists at $f_l$, being $f_l = f_{if}$. Similarly, for signals at frequencies $f_l$, an image frequency signal exists at frequency $f_h$, as $f_h = f_{lo} + f_{if}$.

One of the principal components of the image rejection mixer of the present invention is a controllable switch means, shown generally at 130. The precise nature of the controllable switch means 130 is outside the scope of the present invention. Thus, the details of the controllable switch means 130 of FIG. 5 may be different than the controllable switch means shown in FIG. 4, in that the controllable switch means of FIG. 5 is shown to comprise a pair of FETs, as discussed in greater detail hereafter. In any event, it will be seen from the configuration of any of FIGS. 4, 5, and 6, that the controllable switch means functions as a single pole, double throw switch.

The controllable switch means is controlled by a control signal which is input to the mixer at control signal input port 132; and the purpose of the control signal which is input at the control signal input port 132 is to cause controllable switch 130 to assume one of its two switch positions as a single pole, double throw switch, under the control of the control signals. Thus, a control signal which is, for example, high, will cause the controllable switch means to assume its first switch position; while a control signal which is, for example, low, will cause the controllable switch means to assume its second switch position.

Referring specifically to FIG. 4, once again it is noted that signals at either or both of the high input frequency $f_h$ and/or the low input frequency $f_l$ will appear at the mixer input port 112. From there, they may typically pass through an amplifier 134, and a high pass filter 136, but neither element contributes to the operation of the present invention. However, it will be noted that, in conjunction with the controllable switch means 130, there are two signal paths which are shown by dotted arrows $S_1$ and $S_2$. It is evident that a signal from the mixer input port 112 will flow towards the mixing element 116 within mixer 117, as discussed above, through the controllable switch means 130 along either path $S_1$ or $S_2$, depending on the switch position which the controllable switch means 130 has assumed under the control of control signals applied to it at the control signal input port 132. When the controllable switch means 130 is in its first position, an input signal at frequency $f_h$ will be fed from the mixer input port 112 to the mixing element 116, and an image signal at frequency $f_l$ will be rejected and decoupled from the mixing element 116. Likewise, when the controllable switch means 130 is in its second switch position, a signal at frequency $f_l$ is fed from the mixer input port 112 to the mixing element 116, and an image signal at frequency $f_h$ is rejected and decoupled from the mixing element 116.

Accordingly, the intermediate frequency signal at frequency $f_{if}$ will comprise a downconverted signal representing either of the input signals at frequencies $f_h$ and $f_l$, respectively, together with any noise which may occur at either of those same input signal frequencies. Moreover, the intermediate frequency signal is substantially devoid of a downconverted signal representing the other of the input signals at frequencies $f_l$ and $f_h$, respectively, together with any noise which may occur at that same image frequency.

In keeping with an important provision of the present invention, the first signal path $S_1$ has a bandpass characteristic at a selected frequency which may be either of the input frequencies $f_h$ and $f_l$. This is shown by a filter 138, having a bandpass characteristic, a characteristic curve for which is shown in circle 140.

The second signal path $S_2$ has a filter element 142 having a bandstop characteristic at the same frequency as the bandpass frequency of the filter element 138. A typical characteristic curve of the bandstop filter is shown in circle 144.

As noted, the bandpass characteristic in signal path $S_1$ and the bandstop characteristic in signal path $S_2$, are each established at the same frequency, which may be either input frequency $f_h$ or $f_l$. Assume, for purposes of the present discussion, that the band pass characteristic of element 138 and the bandstop characteristic of element 142 are each set at the higher of the input frequencies $f_h$. Of course, that input frequency $f_h$ is greater than the local oscillator frequency $f_{lo}$ and, as noted above, the intermediate frequency signal will be at a frequency $f_{if} = f_h - f_{lo}$. Thus, the incoming signal $f_h$ is downconverted to frequency $f_{if}$.

At the same time, the image frequency $f_l$, which is computed as $f_l = f_{lo} - f_{if}$, as noted above, will be greatly attenuated by the bandpass filter element 138. Thus, when path $S_1$ is selected by placing the controllable switch means 130 in its first switch position, an image rejection mixer in keeping with prior art convention is implemented, having image rejection at frequency $f_l$ while accepting input signals at frequency $f_h$ for further handling.

Likewise, if signal path $S_2$ is selected by the appropriate control to the controllable switch means 130, and it has a bandstop characteristic at the same frequency as the bandpass characteristic of the filter element 138, then a signal appearing at frequency $f_h$ will not pass through the filter element 142. However, a signal appearing at the input frequency $f_l$ will pass through the filter element 142, since it is assumed that the bandstop characteristic of the bandstop filter is sufficiently narrow that a signal at frequency $f_l$ will pass reasonably unimpeded. Accordingly, that signal at input frequency $f_l$ will pass along signal path $S_2$, when the bandstop characteristic is set at the other input frequency $f_h$; and it will be seen that, likewise, an image rejection mixer is configured whereby an incoming signal at frequency $f_l$ will be downconverted to the intermediate frequency $f_{if}$, but the image frequency at frequency $f_h$ will be rejected because it will not pass through the bandstop filter element 142.

Accordingly, when the bandpass and bandstop filter characteristics of the filter elements 138 and 142 are both set to be operative at the higher of the incoming signal frequencies $f_h$, signal path $S_1$ will provide image rejection for a signal which is located on the high side of the local oscillator frequency $f_{lo}$; and signal path $S_2$ will provide image rejection for a signal located on the low side of the local oscillator frequency $f_{lo}$.

The remainder of the circuit which is shown in FIGS. 4 and 5 includes a receiving antenna 160 which is adapted to receive high radio frequencies and its input port 172. A first mixer 162 is provided, and it receives signals from the receiving antenna 160 and local oscillator signals from a controllable local oscillator 164 at its local oscillator input port 174. The first local oscillator 164, in the context of the circuit diagrams of FIGS. 5 and 6, is under the control of a sweep controller 166 and a microprocessor 168. The arrangement is such that the first intermediate frequency signal which is derived from the output port 170 of the mixer 162 will depend on the control of the local oscillator 164 from the sweep controller 166; and with the knowledge of the incoming frequencies that the receiving antenna 160 will receive and which are of interest, the frequency of the controllable local oscillator may be set at one or another local oscillator frequency whereby the first intermediate frequency signal from output port 170 of the first mixer 162 may be input to the mixer input port 112 of the image rejection mixer 100 at either of a first intermediate frequency signal $f_h$ or a second low intermediate frequency signal $f_l$, as discussed above.

Thus, it is seen that the general schematic circuits of each of FIGS. 4 and 5 provide an image rejection second mixer for a high radio frequency receiver.

One particular form of high radio frequency receiver in which image rejection mixers in keeping with the present invention may be particularly well utilized, is in radar detectors. Further discussion of a typical radar detector configuration will be made hereafter, with reference to FIG. 6. In the meantime, reference is now made specifically to FIG. 5.

In the circuit of FIG. 5, the controllable switch which is shown generally at 130 comprises a pair of FETs 180 and 182. As before, control signals are fed to the controllable switch 130 by being applied at the control signal input port 132. The effect of the control signals is to turn on one of the FETs, by the application of appropriate bias voltage in a manner which is outside the scope of the present invention and, at the same time, to ensure that the other FET is biased off. Thus, if FET 180 is turned on under the control of control signals applied at control signal input port 132, and FET 182 is similarly turned off, the signal path $S_1$ will be operative. Likewise, if FET 182 is controlled to its on condition and FET 180 is controlled to its off condition, the signal path $S_2$ will be operative. For the sake of consistency, it will be assumed that the controllable switch 130 is in its first switch position when FET 180 is conductive and FET 182 is not; and that controllable switch 130 will be in its second switch position when FET 182 is conductive and FET 180 is not.

As shown in FIG. 5, path $S_1$ includes a microstrip bandpass filter structure, which comprises elements 184 and 186. Signal path $S_2$ also includes a microstrip bandstop filter portion 190 of a microstrip element 188.

The operation of the topology of the microstrip filters and FET operating controllable switch, of FIG. 5, is as follows:

When the control signals are applied to the controllable switch 130 such that FET 180 is turned on and FET 182 is turned off, signal path $S_1$ is chosen. As before, signal path $S_1$ exhibits a bandpass characteristic at either input frequency $f_h$ or $f_l$, and signal path $S_2$ exhibits a bandstop characteristic at the same selected frequency $f_h$ or $f_l$.

It will be noted that the drains of FETs 180 and 182 are tied together, by which an output from controllable switch 130 is provided. Moreover, it will be noted that whichever FET 180 or 182 is non-conductive, its gate will present a high impedance which is primarily reactive; and, in a distributed structure such as the microstrip elements of paths $S_1$ and $S_2$, a high impedance termination will become a low impedance one-quarter wavelength from the termination. Care must be taken that the low impedance shall not shunt either of the desired transmission paths $S_1$ and $S_2$, so as not to cause reduced sensitivity. Therefore, the impedance which is reflected from whichever path $S_1$ or $S_2$ has not been selected must not affect the signal transmission in the selected path $S_1$ or $S_2$, at whichever of the input frequencies $f_h$ or $f_l$ is being selected.

In the topology of FIG. 5, if signal path $S_1$ is selected, then the spur line filter portion 190 of the microstrip element 188 will present a short circuit at plane $P_1$ at the frequency of the signal which is being passed through signal path $S_1$. Thus, any impedance which is reflected from the gate of the FET 182 will be forced to zero at plane $P_1$. Moreover, the impedance of zero at plane $P_1$ reflects as an open circuit at plane $P_2$, at the same frequency; and the impedance at plane $P_2$, at that frequency, is independent of the gate impedance of the FET 182. The open circuit at plane $P_2$ in effect creates an appropriate topology for a single resonator bandpass filter at the frequency being transmitted along signal path $S_1$ between the input 112 and the gate of FET 180. This filter rejects the image frequency—which, in this case, is essentially $f_h - 2 \times f_{if}$—and the filter is unaffected by the gate impedance of FET 182.

When signal path $S_2$ is selected, the desired frequency to be downconverted is, in keeping with the discussion thusfar, input frequency $f_l$. In that case, the image frequency is at frequency $f_h$.

FET 182 is turned on, and FET 180 is turned off. Now, the bandstop spur line filter portion 190 in microstrip element 188 rejects the image frequency $f_h$ and passes the desired frequency of interest, input frequency $f_l$.

Moreover, coupling will occur in the initial parallel portions between microstrip element 186 and microstrip element 188, at the selected bandpass and bandstop frequency, so that at frequency $f_h$—for the sake of consistency of this discussion, as noted above—all of the energy injected into the signal path $S_2$ will be coupled to the signal path $S_1$ at that frequency. Moreover, as noted, signal path $S_2$ is intended to reject signals at that frequency, due to its bandstop characteristic at the selected frequency.

Still further, at any other frequencies except those which are quite close to the selected input frequency, signal paths $S_1$ and $S_2$ will not couple to each other because those frequencies will not fall within the tuned frequency of the resonator formed by the element 186 in the signal path $S_1$.

Turning now to FIG. 6, a general schematic for the front end of a broad band, multi-band radar detector is shown generally at 200. Once again, like reference numerals are used for circuit elements and components which are identical to, or which serve the same purpose as, or which operate functionally identically to others which have been discussed above.

Thus, the broad band, multi-band radar detector includes a microprocessor controller 168, a first local oscillator 164, a second local oscillator 120, and a third local oscillator 202. There are three mixers, being a first mixer 162, a second mixer which is an image rejection mixer 100 in keeping with the present invention, and a third mixer 204. Additionally, there is a receiving antenna 160, and user input means 206 which may be such as a switch panel which is used for inputting control criteria to the microprocessor controller 168. As would be expected to be found in any radar detector, the radar detector circuitry 200 includes signal processing means such as an FM demodulator 206, radar signal processing circuitry 208, and audio processing circuitry 210. The functions and purposes of the processing circuits 208 and 210 include indicating which of multiple radar bands being detected has been detected, providing an indication as to the signal strength of the radar band being detected, providing audio warnings, and so on. Indeed, the third mixer 204 might not be present, depending on other parameters of the radar detector design; but, in any event, there will be found appropriate signal processing circuitry and output circuitry, as noted.

With respect to the operation of the circuits of FIGS. 4, 5, and 6, it is convenient in some respects to consider that the frequency of the second local oscillator 120 has an output frequency $f_{lo2}$; and that frequency $f_{lo2}$ is chosen so as to provide an intermediate frequency signal at frequency $f_{if2}$ for either of the two incoming signals at frequencies $f_h$ and $f_l$, respectively. Thus:

$$f_{if2} = f_h - f_{lo2}$$

and $$f_{if2} = f_{lo2} - f_l.$$

Moreover, for signals at frequency $f_h$, there will be an image frequency signal existing at $f_l$, as $f_l = f_{lo2} - f_{if2}$. p Likewise, for signals at frequency $f_l$, there will an image frequency signal existing at $f_h$, as $f_h = f_{lo2} + f_{if2}$.

Accordingly, when either or both of incoming signals at frequencies $f_h$ and $f_l$ are present at the mixer input port 112 of the image rejection mixer 100, and the local oscillator signal at frequency at $f_{lo2}$ is applied at the mixer local oscillator input port 132, an intermediate frequency signal at frequency $f_{if2}$ will be taken from the mixer intermediate frequency output port 114.

Therefore, in keeping with the provisions of this invention, the intermediate frequency signal at frequency $f_{if2}$ will comprise a downconverted signal which represents either of the input signals at frequency $f_h$ or $f_l$; and, in the case of any of the circuits in FIGS. 4, 5, and 6, input signals to the image rejection mixer 100 are effectively intermediate frequency signals which are output from the first mixer 162. In any event, an intermediate frequency signal at frequency $f_{if2}$ comprises a downconverted signal representing either frequency $f_h$ or $f_l$, together with any noise which may occur at that same incoming signal frequency; and the same intermediate frequency signal is substantially devoid of a downconverted signal representing the other of the input signals at frequencies $f_l$ and $f_h$, respectively, together with any noise which may occur at that same image frequency.

Figure 7:
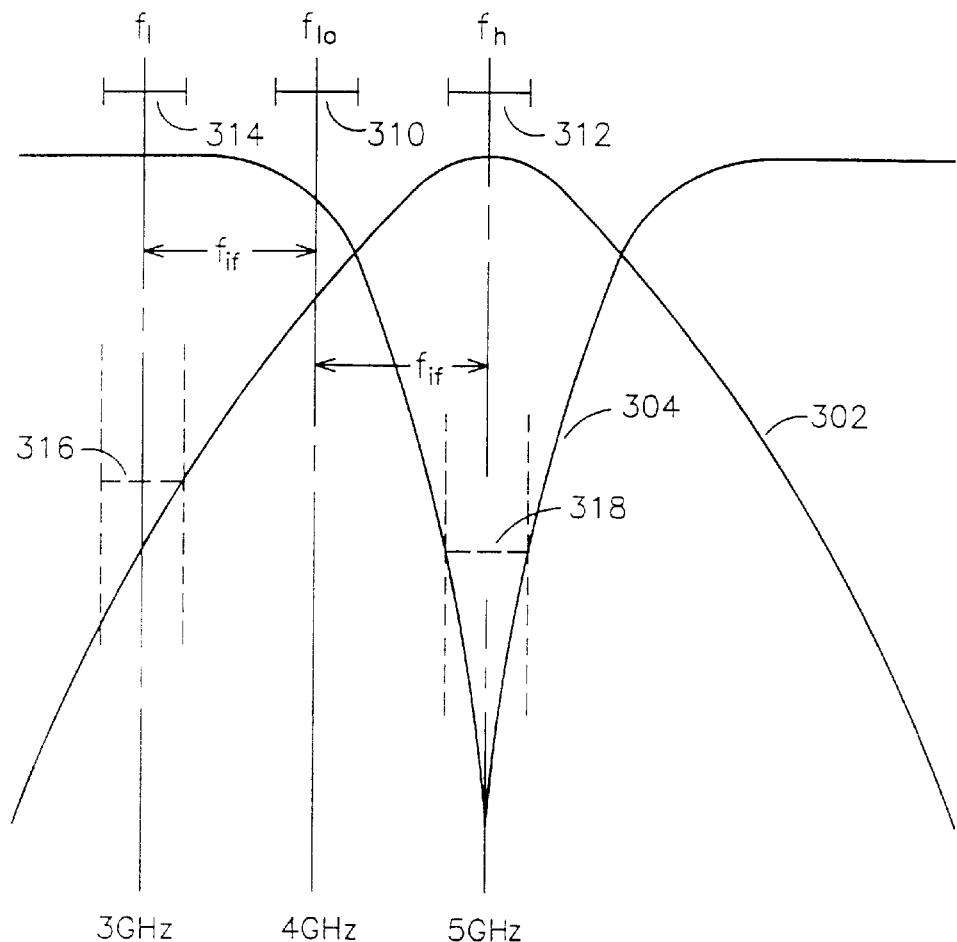
FIG. 7 is a sketch showing the effect of slightly varying the frequency of the local oscillator of the image rejection mixer, over a relatively narrow range of frequencies.

Turning now to FIG. 7, there follows some discussion which demonstrates that the local oscillator frequency which is input to the image rejection mixer of the present invention may be varied over a range—which, typically, may be plus or minus 5% of the initial selected local oscillator frequency.

Two curves 302 and 304 are shown in FIG. 7, which essentially demonstrate the bandpass and bandstop characteristics of the elements 138 and 142—or the structure comprising elements 184, 186, together with element 188—which are found in signal paths $S_1$ and $S_2$ in FIGS. 4 and 5. Those characteristics are also shown, as noted above, in circles 140 and 144 in FIG. 4.

In any event, FIG. 7 also shows three frequencies $f_h$, $f_l$, and $f_{lo}$. The frequency $f_{lo}$ is centred between frequencies $f_h$ and $f_l$, and is separated from them by an amount equal to the intermediate frequency $f_{if}$. For the sake of discussion, $f_{lo}$ can be considered to have an initial selected frequency of 4 GHz; frequency $f_h$ is at 5 GHz, frequency $f_l$ is at 3 GHz, and the intermediate frequency $f_{if}$ is 1 GHz.

Each of the bandpass characteristic curve 302, and the bandstop characteristic curve 304, are centred at $f_h$. That is to say, their highest bandpass signal strength, or bandstop signal rejection, occurs at frequency $f_h$.

The local oscillator frequency $f_{lo}$ may be varied by a small amount, as shown at 310. If, for example, the local oscillator frequency $f_{lo}$ is 4 GHz, and the variation is plus or minus 5% of that initial frequency, then the width of the range of frequencies shown at 310 is 400 MHz (±200 MHz, centred on 4 GHz).

Due to the nature of the mixer, it is known that if the local oscillator frequency is shifted to some extent, then the mixer may be able to select an incoming signal at a frequency which is also shifted by the same amount. This is shown at 312 in respect of a shift of signals at frequency $f_h$, and at 314 in respect of a shift of signals at frequency $f_l$.

It will be noted, with respect to the bandpass characteristic 302, that there is no significant decrease in signal level over the relatively narrow range designated by 312; and that likewise with respect to bandstop characteristic 304, there is no significant change as shown at 314 to the capability of the element 142 to accept and pass a signal which is slightly above or slightly below frequency $f_l$.

As to the image frequencies which may occur, it is clear from FIG. 7 that the same general conditions apply and that, when the frequency of the local oscillator is shifted by a range of up to approximately plus or minus 5% of its initial selected frequency, the image is still significantly attenuated and the image rejection mixer will function as described above. Thus, for a range of signals centred at frequency $f_h$, as shown at 312, there is still significant rejection of the image signal which is centred at 3 GHz, as shown at 316. Likewise, for a range of frequencies centred at frequency $f_l$, as shown at 314, there is still significant image rejection of the image signal centred at 5 GHz, as shown at 318.

Finally, turning to FIGS. 8, 9, and 10, there now follows some discussion as to the wide range of frequencies which may be selected of interest in such as a radar detector as shown at 200 in FIG. 6. Essentially, FIGS. 8, 9, and 10 demonstrate the effect of low side or high side oscillator injection, where the incoming signals to the image rejection mixer may be at either of frequencies $f_h$ and $f_l$, as discussed above.

Again, for ease of discussion, it is assumed that frequencies $f_h$ and $f_l$, as shown in the chart in FIG. 8 as $f_{112}$—the frequency which occurs at the input port 112 of the rejection mixer 100—may be either 5 GHz or 3 GHz.

It has been noted that the frequency of the first local oscillator 164 may be altered under the control of the sweep controller 166 and microprocessor 168; and, for purposes of the present discussion, it is assumed that the output frequency of the first local oscillator 164 may be, at its minimum, 15 GHz—shown in FIG. 8 as $f_{164MIN}$—and that the maximum output frequency from the first local oscillator 164 will be 16 GHz—shown in FIG. 8 as $f_{164MAX}$.

It is also clearly to be understood that the first local oscillator 164, although spoken of as being under the control of the sweep controller 166, and microprocessor 168, may also be considered more generally to be a swept frequency local oscillator. In other words, the frequency of the local oscillator may assume any frequency within the range being discussed with respect to its sweep range; and, in any event, the control of the oscillator sweep control signals will ultimately reside with a microprocessor control. Moreover, in keeping with discussion above with respect to altering the frequency of the local oscillator, a swept frequency local oscillator may well be one whose frequency alters over a range of, for example, plus or minus 5% of the centre frequency.

If the oscillator injection in the image rejection mixer 100—that is, the frequency of local oscillator 120—is below the input frequency at input port 112, then it can be seen that for frequency $f_{112}$ to be 5 GHz when frequency $f_{164MAX}$ is 16 GHz, the frequency of interest which will be detected at receiving antenna 160—designated in FIG. 8 as frequency $f_{160MAX}$—will be 21 GHz. This is seen from the mathematical relationships that $f_{164MAX}$ at 16 GHz plus $f_{112}$ at 5 GHz provides for $f_{160MAX}$ to be detected at 21 GHz.

Likewise, for low side injection, with the frequency of the local oscillator $f_{164MIN}$ being 15 GHz, the circuit of FIG. 6 will detect incoming signals at receiving antenna 160 at a frequency of $f_{160MIN}$, which will be 20 GHz.

The same conditions apply with respect to high side oscillator injection, where $f_{160MAX}$ may be 11 GHz (determined by the difference between $f_{164MAX}$ at 16 GHz and $f_{112}$ at 5 GHz), and $f_{160MIN}$ may be 10 GHz.

The second line of the chart shown in FIG. 8 demonstrates the same conditions, except when the input frequency at input port 112 in FIG. 6 is at frequency $f_l$—which, for purposes of this discussion, is assumed to be 3 GHz.

The chart of FIG. 8 is shown graphically in FIGS. 9 and 10. From these Figures, it can be seen that, by tuning a first local oscillator over a 1 GHz bandwidth (15 GHz to 16 GHz), it is possible to receive incoming signals covering 4 GHz of bandwidth (10 GHz to 11 GHz, 12 GHz to 13 GHz, 18 GHz to 19 GHz, and 20 GHz to 21 GHz).

It follows from the above discussion that, simply by altering the frequency of the first local oscillator from 15 GHz to 16 GHz, to use the example being discussed, and where the input frequency to the image rejection mixer 100, at input port 112, may be either 5 GHz or 3 GHz, a radar detector front end may be devised to accept and downconvert incoming radar frequency signals over a broad range of frequencies, without the addition of image noise at the second mixer. All of this is made possible, however, by use of the image rejection mixer of the present invention, whereby an image frequency signal, and any noise which would otherwise be apparent at the same frequency as the image frequency signal, is rejected and only the signal of interest is downconverted through the image rejection mixer for further signal handling.

There has been described an image rejection mixer for downconversion of an incoming signal, in which one or the other of two incoming signals may be discriminated while the other of the incoming signals is rejected. More particularly, the noise which will also be present at the image frequency will also be rejected. The sensitivity of circuits employing an image rejection mixer for downconversion, in keeping with the present invention, is therefore considerably enhanced.

Other modifications and alterations may be used in the design and manufacture of the apparatus of the present invention without departing from the spirit and scope of the accompanying claims.

What is claimed is:

1. An image rejection mixer for down conversion of an incoming signal to a lower intermediate frequency signal, using the absolute difference of frequencies between the incoming signal and a local oscillator signal; wherein said image rejection mixer has a local oscillator whose local oscillator signal frequency $f_{lo}$ is chosen so as to provide an intermediate frequency signal at frequency $f_{if}$ for either of two incoming signals at frequencies $f_h$ and $f_l$, respectively, whereby $$f_{if}=f_h-f_{lo}$$

and $$f_{if}=f_{lo}-f_l;$$

wherein for signals at frequency $f_h$, an image frequency signal exists at $f_l$, as $f_l=f_{lo}-f_{if}$; and
wherein for signals at frequency $f_l$, an image frequency signal exists at $f_h$, as $f_h=f_{lo}+f_{if}$;
said image rejection mixer further comprising an input port at which either or both of said incoming signals at frequency $f_h$ and frequency $f_l$ are present, a controllable switch means, a control signal input port for said controllable switch means, a mixing element, a mixer local oscillator input port at which said local oscillator signal at frequency $f_{lo}$ is applied, and a mixer intermediate frequency output port from which said intermediate frequency signal at frequency $f_{if}$ is taken;
said controllable switch means having two switch positions, and being capable of assuming either of a first switch position and a second switch position under the control of control signals applied to said control signal input port;
said image rejection mixer arranged so that signals from said mixer local oscillator input port are applied to said mixing element, and so that intermediate frequency signals which are derived from said mixing element are applied to said mixer intermediate frequency output port;
said mixing element being preceded by said controllable switch means having two positions so that, when said controllable switch means is in said first position thereof, a signal at frequency $f_h$ is fed from said mixer input port to said mixing element, and an image signal at frequency $f_l$ is rejected and decoupled from said mixing element; and when said controllable switch means is in said second position thereof, a signal at frequency $f_l$ is fed from said mixer input port to said mixing element, and an image signal at frequency $f_h$ is rejected and decoupled from said mixing element;
said intermediate frequency signal at frequency $f_{if}$ comprising a downconverted signal representing either of said input signals at frequencies $f_h$ and $f_l$, respectively, together with any noise which may occur at either of those same input signal frequencies; said intermediate frequency signal being substantially devoid of a downconverted signal representing the other of said input signals at frequencies $f_l$ and $f_h$, respectively, together with any noise which may occur at that same image frequency.

2. The image rejection mixer of claim 1, in which said controllable switch means comprises a pair of controllable FETs, either one of which may be turned on while the other is turned off by the application of signals to said control signal input port, so as to assume said first and second switch positions, respectively.

3. The image rejection mixer of claim 2, in which a first one of said pair of controllable FETs is connected in a first signal path between said mixer input port and said mixing element, said first signal path having a bandpass characteristic at a selected frequency which is either of said input frequencies $f_h$ and $f_l$; and a second one of said pair of controllable FETs is connected in a second signal path between said mixer input port and said mixing element, said second signal path having a bandstop characteristic at the same selected frequency as the bandpass frequency of said first signal path;

said first and second signal paths being selectable by control of the on and off states of said pair of FETs to said first switch position and said second switch position, respectively.

4. The image rejection mixer of claim 3, in which said first selectable signal path includes a microstrip bandpass filter structure, and said second selectable signal path includes a microstrip bandstop filter structure;

said first and second selectable signal paths being coupled to each other at said selected frequency.

5. The image rejection filter of claim 1, in which said switch functions as a single pole, double throw switch; a first signal path being connected between said mixer input port and said mixing element when said switch is in said first position, and a second signal path being connected between said mixer input port and said mixing element when said switch is in said second position;

said first signal path having a bandpass characteristic at a selected frequency which is either of said input frequencies $f_h$ and $f_l$, and said second signal path having a bandstop characteristic at the same selected frequency as the bandpass frequency of said first signal path;

said first and second signal paths being selectable by controlling said switch by the application of signals to said control signal input port, so as to assume either of said first and second switch positions, respectively.

6. The image rejection mixer of claim 5, in which said first selectable signal path includes a microstrip bandpass filter structure, and said second selectable signal path includes a microstrip bandstop filter structure;

said first and second selectable signal paths being coupled to each other at said selected frequency.

7. The image rejection mixer of claim 1, in which the frequency $f_{lo}$ of said local oscillator may be varied over a range of plus or minus 5% of its initial selected frequency.

8. The image rejection mixer of claim 7, in which the frequencies $f_h$ and $f_l$ of the two incoming signals are 5 GHz and 3 GHz respectively, and the initial selected frequency $f_{lo}$ of the local oscillator is 4 GHz.

9. An image rejection front end for a high radio frequency receiver, comprising:

a receiving antenna for high radio frequencies;

a first local oscillator;

a first mixer having an input signal port to which signals from said receiving antenna are applied, a local oscillator input port to which signals from said first local oscillator are applied, and an output port from which a first intermediate frequency signal is derived;

said first local oscillator being under the control of a sweep controller and a microprocessor, and being such that said first intermediate frequency signal is derived at one of a first high intermediate frequency signal $f_h$ and a second low intermediate frequency signal $f_l$;

a second mixer having a signal input port into which signals at either of said first high intermediate frequency signal $f_h$ and said second low intermediate frequency $f_l$ are applied, a local oscillator input port into which signals from a second local oscillator are applied, a signal input path interposed between said output port of said first mixer and said signal input port of said second mixer, and an output port from which signals are derived for further signal handling;

said second mixer being an image rejection mixer for selective down conversion of an incoming signal to a lower intermediate frequency signal, using the absolute difference of frequencies between either of said first high intermediate frequency signal $f_h$ and said second low intermediate frequency signal $f_l$ and a fixed frequency local oscillator signal from a fixed frequency local oscillator;

said fixed frequency local oscillator being said second local oscillator which has an output frequency $f_{lo2}$, said frequency $f_{lo2}$ being chosen so as to provide an intermediate frequency signal at frequency $f_{if2}$ for either of two incoming signals at said frequencies $f_h$ and $f_l$, respectively, whereby $$f_{if2}=f_h-f_{lo2}$$

and $$f_{if2}=f_{lo2}-f_l;$$

wherein for signals at frequency $f_h$, an image frequency signal exists at $f_l$, as $f_l=f_{lo2}-f_{if2}$; and wherein for signals at frequency $f_l$, an image frequency signal exists at $f_h$, as $f_h=f_{lo2}+f_{if2}$;

said image rejection mixer comprising an input port at which either or both of said incoming signals at frequency $f_h$ and frequency $f_l$ are present, a controllable switch means, a control signal input port for said controllable switch means, a mixing element, a mixer local oscillator input port at which said local oscillator signal at frequency $f_{lo2}$ is applied, and a mixer intermediate frequency output port from which said intermediate frequency signal at frequency $f_{if2}$ is taken;

said controllable switch means having two switch positions, and being capable of assuming either of a first switch position and a second switch position under the control of control signals applied to said control signal input port;

said image rejection mixer being arranged so that signals from said mixer local oscillator input port are applied to said mixing element, and so that intermediate frequency signals which are derived from said mixing element are applied to said mixer intermediate frequency output port;

said mixing element being preceded by said controllable switch means having two positions so that, when said controllable switch means is in said first position thereof, a signal at frequency $f_h$ is fed from said mixer input port to said mixing element, and an image signal at frequency $f_l$ is rejected and decoupled from said mixing element; and when said controllable switch means is in said second position thereof, a signal at frequency $f_l$ is fed from said mixer input port to said mixing element, and an image signal at frequency $f_h$ is rejected and decoupled from said mixing element;

said intermediate frequency signal at frequency $f_{if2}$ comprising a downconverted signal representing either of said input signals at said high intermediate frequency $f_h$ and said low intermediate frequency $f_l$, together with any noise which may occur at either of those same incoming signals from said first intermediate frequency signal frequencies $f_h$ and $f_l$, respectively; said second intermediate frequency signal being substantially devoid of a downconverted signal representing the other of said input signals at frequencies $f_l$ and $f_h$, respectively, together with any noise which may occur at that same image frequency.

10. The image rejection front end for a high radio frequency receiver of claim 9, in which said controllable switch means comprises a pair of controllable FETs, either one of which may be turned on while the other is turned off by the application of signals to said control signal input port, so as to assume said first and second switch positions, respectively.

11. The image rejection front end for a high radio frequency receiver of claim 10, in which a first one of said pair of controllable FETs is connected in a first signal path between said mixer input port and said mixing element, said first signal path having a bandpass characteristic at a selected frequency which is either of said input frequencies $f_h$ and $f_l$, and a second one of said pair of controllable FETs is connected in a second signal path between said mixer input port and said mixing element, said second signal path having a bandstop characteristic at the same selected frequency as the bandpass frequency of said first signal path;

said first and second signal paths being selectable by control of the on and off states of said pair of FETs to said first switch position and said second switch position, respectively.

12. The image rejection front end for a high radio frequency receiver of claim 11, in which said first selectable signal path includes a microstrip bandpass filter structure, and said second selectable signal path includes a microstrip bandstop filter structure;

said first and second selectable signal paths being coupled to each other at said selected frequency.

13. The image rejection front end for a high radio frequency receiver of claim 9, in which said switch functions as a single pole, single throw switch; a first signal path being connected between said mixer input port and said mixing element when said switch is in said first position, and a second signal path being connected between said mixer input port and said mixing element when said switch is in said second position;

said first signal path having a bandpass characteristic at a selected frequency which is either of said input frequencies $f_h$ and $f_l$, and said second signal path having a bandstop characteristic at the same selected frequency as the bandpass frequency of said first signal path;

said first and second signal paths being selectable by controlling said switch by the application of signals to said control signal input port, so as to assume either of said first and second switch positions, respectively.

14. The image rejection front end for a high radio frequency receiver of claim 13, in which said first selectable signal path includes a microstrip bandpass filter structure, and said second selectable signal path includes a microstrip bandstop filter structure;

said first and second selectable signal paths coupled to each other at said selected frequency.

15. A front end for a broad band, multi-band radar detector;

said radar detector comprising a microprocessor controller, a first local oscillator, a second local oscillator, a third local oscillator, a first mixer, a second mixer, a receiving antenna, user input means for inputting control criteria to said microprocessor controller, signal processing means for processing signals input thereto, and output means for outputting visual and/or audio output signals in response to output signals from said signal processing means which indicate the reception of radar signals of interest by said receiving antenna;

said front end for said radar detector comprising:

said first mixer, having a signal input port into which signals from said receiving antenna are applied, a local oscillator input port into which signals from said first local oscillator are applied, and an output port from which signals at a first intermediate frequency are derived;

said first local oscillator being a swept frequency local oscillator; said first mixer being under the control of said microprocessor controller so as to permit said first intermediate frequency to be one or the other of a first high intermediate frequency signal $f_h$ and a second low intermediate frequency signal $f_l$;

said second mixer, having a signal input port into which signals at either of said first high intermediate frequency signal $f_h$ and said second low intermediate frequency signal $f_l$ are applied, a local oscillator input port into which signals from said second local oscillator are applied, a signal input path interposed between said output port of said first mixer and said signal input port of said second mixer, and an output port from which signals are derived for further signal handling;

said second mixer being an image rejection mixer for selective down conversion of an incoming signal to a lower intermediate frequency signal, using the absolute difference of frequencies between either of said first high intermediate frequency signal $f_h$ and said second low intermediate frequency signal $f_l$ and a fixed frequency local oscillator signal from a fixed frequency local oscillator;

said fixed frequency local oscillator being said second local oscillator which has an output frequency $f_{lo2}$, said frequency $f_{lo2}$ being chosen so as to provide an intermediate frequency signal at frequency $f_{if2}$ for either of two incoming signals at said frequencies $f_h$ and $f_l$, respectively, whereby $$f_{if2}=f_h-f_{lo2}$$

and $$f_{if2}=f_{lo2}-f_l;$$

wherein for signals at frequency $f_h$, an image frequency signal exists at $f_l$, as $f_l f_{lo2}-f_{if2}$; and wherein for signals at frequency $f_l$, an image frequency signal exists at $f_h$, as $f_h=f_{lo2}+f_{if2}$;

said image rejection mixer comprising an input port at which either or both of said incoming signals at frequency $f_h$ and frequency $f_l$ are present, a controllable switch means, a control signal input port for said controllable switch means, a mixing element, a mixer local oscillator input port at which said local oscillator signal at frequency $f_{lo2}$ is applied, and a mixer intermediate frequency output port from which said intermediate frequency signal at frequency $f_{if2}$ is taken;

said controllable switch means, having two switch positions, and being capable of assuming either of a first switch position and a second switch position under the control of control signals applied to said control signal input port;

said image rejection mixer being arranged so that signals from said mixer local oscillator input port are applied to said mixing element, and so that intermediate frequency signals which are derived from said mixing element are applied to said mixer intermediate frequency output port;

said mixing element being preceded by said controllable switch means having two positions so that, when said controllable switch means is in said first position thereof, a signal at frequency $f_h$ is fed from said mixer input port to said mixing element, and an image signal at frequency $f_l$ is rejected and decoupled from said mixing element; and when said controllable switch means is in said second position thereof, a signal at frequency $f_l$ is fed from said mixer input port to said mixing element, and an image signal at frequency $f_h$ is rejected and decoupled from said mixing element;

said intermediate frequency signal at frequency $f_{if2}$ comprising a downconverted signal representing either of said input signals at said high intermediate frequency $f_h$ and said low intermediate frequency $f_l$, together with any noise which may occur at either of those same incoming signals from said first intermediate frequency signal frequencies $f_h$ and $f_l$, respectively; said second intermediate frequency signal being substantially devoid of a downconverted signal representing the other of said input signals at frequencies $f_l$ and $f_h$, respectively, together with any noise which may occur at that same image frequency;

said front end further comprising said signal processing means for further signal processing, and said output means.

16. The front end for a broad band, multi-band radar detector of claim 15, in which said switch means comprises a pair of controllable FETs, either one of which may be turned on while the other is turned off by the application of signals to said control signal input port, so as to assume said first and second switch positions, respectively.

17. The front end for a broad band, multi-band radar detector of claim 16, in which a first one of said pair of controllable FETs is connected in a first signal path between said mixer input port and said mixing element, said first signal path having a bandpass characteristic at a selected frequency which is either of said input frequencies $f_h$ and $f_l$, and a second one of said pair of controllable FETs is connected in a second signal path between said mixer input port and said mixing element, said second signal path having a bandstop characteristic at the same selected frequency as the bandpass frequency of said first signal path;

said first and second signal paths being selectable by control of the on and off states of said pair of FETs to said first switch position and said second switch position, respectively.

18. The front end for a broad band, multi-band radar detector of claim 17, in which said fist selectable signal path includes a microstrip bandpass filter structure, and said second selectable signal path includes a microstrip bandstop filter structure;

said first and second selectable signal paths being coupled to each other at said selected frequency.

19. The front end for a broad band, multi-band radar detector of claim 17, in which said first selectable signal path includes a microstrip bandpass filter structure, and said second selectable signal path includes a microstrip bandstop filter structure;

said first and second selectable signal paths being coupled to each other at said selected frequency.

20. The front end for a broad band, multi-band radar detector of claim 15, in which said switch functions as a single pole, single throw switch; a first signal path being connected between said mixer input port and said mixing element when said switch is in said first position, and a second signal path being connected between said mixer input port and said mixing element when said switch is in said second position;

said first signal path having a bandpass characteristic at a selected filter frequency which is either of said input frequencies $f_h$ and $f_l$, and said second signal path having a bandstop characteristic at the same selected filter frequency as the bandpass frequency of said first signal path;

said first and second signal paths being selectable by controlling said switch by the application of signals to said control signal input port, so as to assume either of said first and second switch positions, respectively.

\* \* \* \* \*